United States Patent
Edwards et al.

(10) Patent No.: US 6,498,502 B2
(45) Date of Patent: Dec. 24, 2002

(54) APPARATUS AND METHOD FOR EVALUATING SEMICONDUCTOR STRUCTURES AND DEVICES

(75) Inventors: Henry L. Edwards, Garland, TX (US); Theodore S. Moise, Los Altos, CA (US); Glen D. Wilk, New Providence, NJ (US)

(73) Assignee: Texas Instrument Incorporated, Dallas, TX (US)

( * ) Notice: Subject to any disclaimer, the term of this patent is extended or adjusted under 35 U.S.C. 154(b) by 0 days.

(21) Appl. No.: 09/737,365

(22) Filed: Dec. 14, 2000

(65) Prior Publication Data

US 2002/0075017 A1 Jun. 20, 2002

Related U.S. Application Data

(60) Provisional application No. 60/174,431, filed on Jan. 4, 2000.

(51) Int. Cl.$^7$ .................. G01R 31/302; G01R 31/26; H01L 21/66
(52) U.S. Cl. .............. 324/750; 324/765; 438/17
(58) Field of Search .................. 324/158.1, 765, 324/750; 250/306, 559.2, 559.29; 438/17

(56) References Cited

U.S. PATENT DOCUMENTS

| | | | |
|---|---|---|---|
| 5,053,699 A | 10/1991 | Aton | 324/158 R |
| 5,426,302 A | 6/1995 | Marchman et al. | 250/306 |
| 5,517,027 A | 5/1996 | Nakagawa et al. | 250/306 |
| 5,523,700 A | 6/1996 | Williams et al. | 324/765 |
| 5,793,051 A * | 8/1998 | Stern et al. | 250/559.2 |

OTHER PUBLICATIONS

Rebecca Howland and Lisa Benatar, "A Practical Guide to Scanning Probe Microscopy", Park Scientific Instruments, 1993–1997.
Materials Research Science and Engineering Center, "The Atomic Force Microscope", University of Chicago <http://jfi.uchicago.edu/MRSEC/Nuggets/Stripes/afm.html>, Printed Oct. 26, 1999.
Condensed Matter Theory Group, "The Atomic Force Microscope (AFM)", Imperial College of Science, Technology and Medicine <http://www.sst.ph.ic.ac.uk/photnics/intro/AFM.html>, Printed Nov. 3, 1999.

* cited by examiner

*Primary Examiner*—Michael Sherry
*Assistant Examiner*—Paresh Patel
(74) *Attorney, Agent, or Firm*—Yingsheng Tung; Wade James Brady, III; Frederick J. Telecky, Jr.

(57) ABSTRACT

An apparatus and method for evaluating semiconductor structures and devices are provided. A method for evaluating at least one selected electrical property of a semiconductor device (201) in relation to a selected geometric dimension of the semiconductor device (201). The method further includes forming a plurality of semiconductor devices (201) on a substrate (202), the devices (201) having at least one geometric dimension, measuring the at least one electrical property of at least one of the semiconductor devices (201) using a scanning probe microscopy based technique, and determining a relationship between the measured electrical property and the selected geometric dimension of the semiconductor device (201). The method further includes evaluating at least one semiconductor fabrication process based upon the determined relationship.

3 Claims, 2 Drawing Sheets

US 6,498,502 B2

APPARATUS AND METHOD FOR EVALUATING SEMICONDUCTOR STRUCTURES AND DEVICES

This application claims priority under 35 USC § 119(e)(1) of provisional application No. 60/174,431 filed Jan. 4, 2000.

TECHNICAL FIELD OF THE INVENTION

This invention generally relates to the field of electronic devices. More specifically this invention relates to an apparatus and method for evaluating semiconductor structures and devices.

BACKGROUND OF THE INVENTION

Advancements in the semiconductor industry have converged on developing submicron geometric devices for microelectronic circuits. Semiconductor fabrication processes, in their infancy, were sometimes plagued with fatal defectivity that inhibited the production of integrated circuits. As semiconductor fabrication processes became more advanced, the level and occurrence of defects in semiconductor devices have decreased. However, the reduction of semiconductor geometries to submicron levels has manifested inherent defect modes which may impact the performance of resulting semiconductor devices.

Silicon wafers provide a common substrate used to fabricate multiple semiconductor devices. As geometries for semiconductor devices are reduced, the inherent characteristics of the device's materials such as silicon become a significant factor. Structural defects are one of the inherent problems facing the advancement of submicron semiconductor devices. Some structural defects negatively impact device performance and may effect, for example, leakage currents, carrier lifetimes, and gate oxide integrity.

There are several different classifications of structural and process defects that can occur in semiconductor devices. One defect that occurs in semiconductor processing is an area defect called grain boundaries. Grain boundaries occur when certain planes of atoms terminate from one process layer and a subsequent layer fills-in the region between the two grains. For example, when an oxide layer is deposed onto silicon, the atoms in the region of the boundary are displaced from their normal position. This displacement is generally confined to a region very close to the grain boundary. Thus, a semiconductor device having multiple process layers typically has several different material interfaces. As a result, any two layers may have an angle of misorientation that occurs during a single process. As grains of the layers form an intersection, certain rows of atoms within each layer's lattice structure may not line up and extend their full length at the junction. This causes a dislocation between the two layers resulting in a grain boundary.

Another defect that occurs in semiconductors is caused by voids in the lattice material due to precipitates of extrinsic or intrinsic point defects. Precipitates are a complicated defect mode that include the formation of an intermediate crystal structure that later transforms into a final structure. The initially formed precipitate particle is called a nuclei and the transformation process is called a nucleation process. The nucleation process can occur in two ways, heterogeneous nucleation that occurs at a crystalline defect such as a dislocation, a grain boundary, or an impurity. The second process is homogenous nucleation, a random composition of the nuclei. In general, during a nucleation process, the more rapid diffusion of the semiconductor material, the more quickly precipitation occurs.

A bulk defect that occurs in one silicon crystal layer can be the cause of other crystalline defects as additional layers are grown. For example, the growth of oxygen precipitates in silicon occurs by the reaction of oxygen with silicon at the precipitate surface to form silicon dioxide. The volume change from silicon to silicon dioxide is almost two to one with silicon dioxide being the larger. Consequently, the lattice surrounding the silicon dioxide precipitate is subject to large compressions placing undue stress on the lattice and junction regions which can lead to a bulk defect within the lattice structure.

Therefore, as semiconductor device geometry's become smaller, evaluating the effects of both intrinsic and extrinsic defects are critical in optimizing the performance of semiconductor devices and structures and associated fabrication processes.

SUMMARY OF THE INVENTION

In accordance with the present invention, an apparatus and methods are provided which substantially eliminates or reduces disadvantages and problems associated with prior device evaluation methods and apparatuses.

The present invention discloses a method for evaluating at least one selected electrical property of a semiconductor device in relation to a selected geometric dimension of the semiconductor device. The method includes forming a plurality of semiconductor devices on a substrate, the devices having at least one geometric dimension, measuring the at least one electrical property of at least one of the semiconductor devices using a scanning probe microscopy based technique, and determining a relationship between the measured electrical property and the selected geometric dimension of the semiconductor device. The method further includes evaluating at least one semiconductor fabrication process based upon the determined relationship.

More specifically, the method further includes measuring a topography of the semiconductor device using a scanning probe microscopy based technique.

More specifically, the method further includes measuring the topography in a region proximal to the measured electrical property.

The present invention also provides a method for evaluating a semiconductor device. The method includes providing the semiconductor device, measuring a first characteristic of the device using a first--scanning probe microscopy technique, and measuring an electrical property of the device using a second scanning probe microscopy technique. The method further includes determining variations in the semiconductor device based upon the measured first characteristic and the measured electrical property wherein the first characteristic and the electrical property are measured in a proximal region to one another.

More specifically, the method includes providing a semiconductor device with a selected geometric dimension of less than one micrometer.

More specifically, the method includes measuring the first characteristic and the electrical property simultaneously.

The present invention further provides a system for evaluating semiconductor devices. The system includes a processor, a storage medium operably coupled to the processor, a scanning probe microscopy device, operably coupled to the processor to evaluate semiconductor devices wherein the scanning probe microscopy includes a probe configured to measure at least one electrical property of the semiconductor device. The system further includes a program of instructions for evaluating a semiconductor device, the program of instructions including at least one instruction configured to measure the at least one electrical property and determining a relationship between the measured electrical property and at least one geometric dimension of the device.

More specifically, the system is configured to include a nanoscopic probe.

BRIEF DESCRIPTION OF THE DRAWINGS

For a more complete understanding of the present invention and the advantages thereof, reference is now made to the following description taken in-conjunction with the accompanying drawings in which like reference numbers indicate like features and wherein.

DETAILED DESCRIPTION OF THE INVENTION

Figure 1:
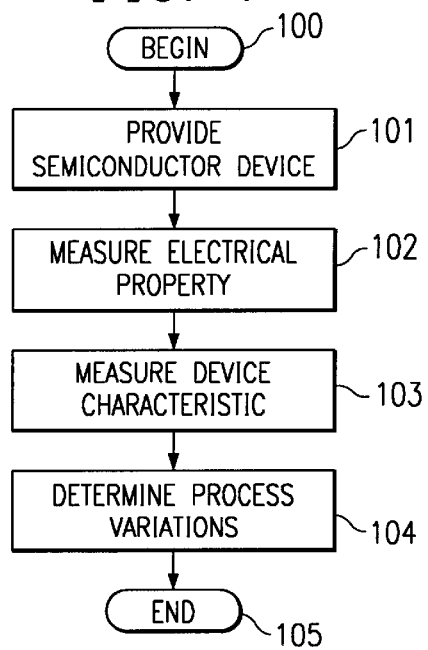
FIG. 1 illustrates a flow diagram of one embodiment of a method for evaluating semiconductor devices and associated fabrication process according to the present invention.

Referring to FIG. 1, an illustration of a flow diagram of one embodiment of a method for evaluating semiconductor devices and associated fabrication process is shown. The method begins at step 100. At step 101 a semiconductor device is provided having at least one selected geometric dimension. The semiconductor device may be created using advanced semiconductor processes and in one embodiment includes an array of capacitive structures fabricated to a minimum design rule. The geometric dimensions of the semiconductor devices are varied to separate an edge effect from a bulk effect. An edge effect typically includes a measured property that is impacted by the close proximity of the device boundary which may cause, among other things, electric field spreading, trap states, lattice defects or other defects. A bulk effect may include the situation in which the measured property is independent of any boundary effects. In one embodiment, the semiconductor device may include submicron geometric dimensions (i.e. less than 1 micrometer). In another embodiment, a geometric dimension could be the channel length of a semiconductor device, the area defined by a contact, a defect area such as a grain boundary or a void in a lattice, or other geometric dimensions produced using semiconductor processes.

The method then proceeds to step 102 where at least one electrical property of the semiconductor device is measured using a scanning probe microscopy (SPM) technique. Different types of electrical properties can be measured such as, conductivity, voltage, capacitance, resistivity, leakage, etc. Additionally, many different SPM techniques may be used while measuring the electrical properties. For example, SPM techniques that may be used include, but are not limited to, Scanning Tunnel Microscopy (STM), Atomic Force Microscopy (AFM), Magnetic Force Microscopy (MFM), Lateral Force Microscopy (LFM), Force Modulation Microscopy (FMM), Phase Detection Microscopy (PDM), Electrostatic Force Microscopy (EFM), Scanning Capacitance Microscopy (SCM), and Thermal Scanning Microscopy (TSM). By using one of the above techniques, the method can measure many different types of characteristic in addition to electrical properties of the semiconductor device. For example, the method can measure device characteristics such as dopant profiles, surface conductivity, static charge distributions, elastic properties, adhesion properties, thermal conductivity data, or other properties measurable by an SPM technique.

Upon measuring an electrical property of the semiconductor device, the method proceeds to step 103 where a characteristic of the semiconductor device is measured using a second SPM technique in a proximal region to the measured electrical property of step 102. For example, the characteristic could be a topographical characteristic of the semiconductor device measured using an atomic force microscope (AFM) technique, an SPM technique used to provide images of a semiconductor device's topography. In one embodiment, an AFM measurement is made in a proximal region to the measured electrical property such that the measurements, in combination, reflect the characteristics of the same location of the semiconductor device. For some applications, the AFM measurement can be made in the same location as the electrical property measurement such that point-by-point measurements of the semiconductor device may be made.

At step 104 the method evaluates the electrical measurement of step 102 and the measured characteristic of step 103. For example, if at step 102 a gate oxide integrity (GOI) measurement was made at a location on the semiconductor device and at step 103 a geometric dimension of the semiconductor device was measured, the method would evaluate the GOI measurement and the measured geometric dimension to determine any process variations used to fabricate the evaluated device. In a further example, a grain boundary of a semiconductor device can be characterized by measuring an electrical property of the grain boundary at step 102 and an AFM measurement measuring a geometric dimension of the grain boundary at step 103. Therefore, at step 104 the method determines process variations based upon the grain boundary's electrical property, such as low conductivity, to its geometric dimension such as ten nanometers. In this manner, an evaluation of the semiconductor device and associated fabrication processes can be made using an electrical property of the semiconductor and one other measurement, such as an AFM measurement, thereby characterizing the semiconductor device through evaluating the semiconductor device to determine process variations. The method then proceeds to step 105 where the method ends.

Figure 2:
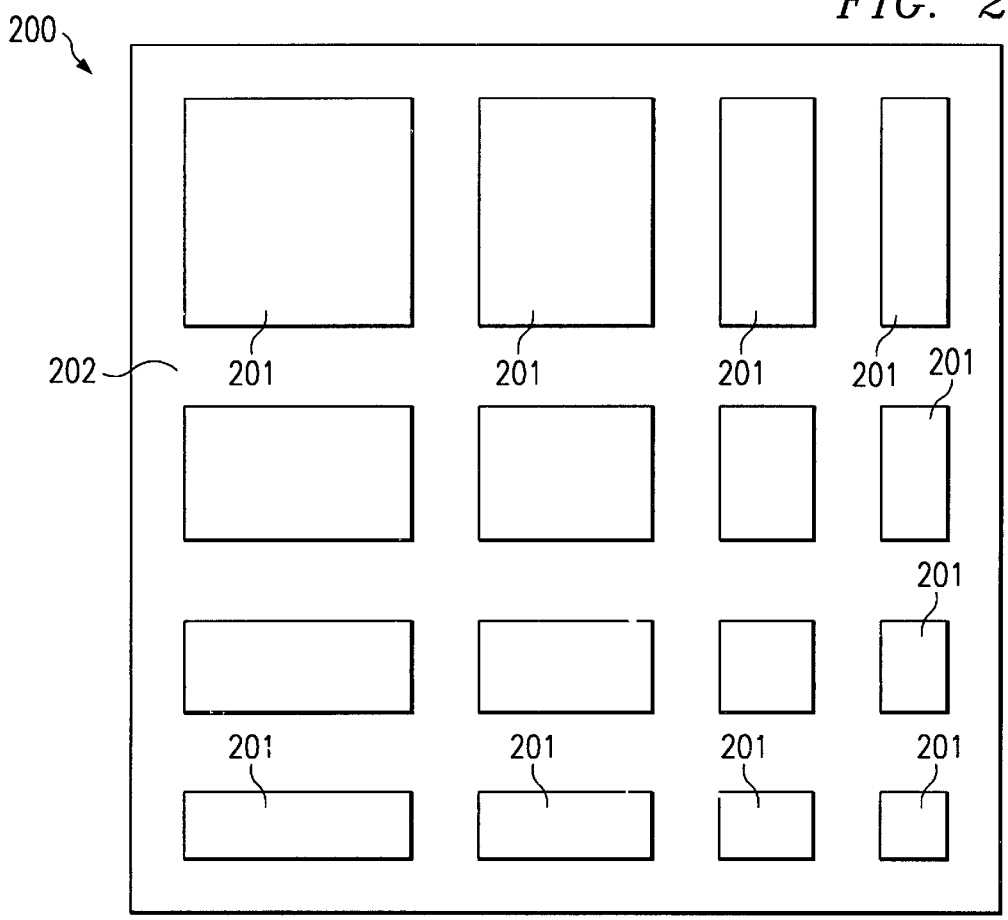
FIG. 2 illustrates a semiconductor evaluation structure for characterizing semiconductor devices according to one embodiment of the present invention.

FIG. 2 shows one example of a semiconductor evaluation structure for characterizing semiconductor devices according to teachings of the present invention. The evaluation structure, shown generally at 200, may be provided using several semiconductor processes. A general description of a semiconductor fabrication a process is provided below. Evaluation structure 200 includes a plurality of semiconductor devices shown collectively by reference numeral 201 fabricated on substrate 202. In one embodiment, evaluation structure 200 may be included within a die of a microelectronic device or circuit such as a microcontroller, memory device or other microelectronic device. Evaluation structure 200 may be fabricated during the fabrication of the microelectronic device or may be fabricated exclusive of microelectronic devices.

In one embodiment semiconductor devices 201 located on substrate 202 may include various selected geometric dimensions (i.e. ten microns, one hundred nanometers, ten nanometers, etc.) Semiconductor devices 201 may be provided using advanced photolithography processes providing semiconductor devices with a plurality of submicron geometric dimensions. Substrate 202 having a plurality of semiconductor devices 201 with various geometric dimensions can be used to evaluate semiconductor processes used to create evaluation structure 200. For example, semiconductor device 201 may be a capacitive structure fabricated using minimum design rules and having geometric dimensions of less than one micrometer. The capacitive structure may be tested for an electrical property and, based upon the measured electrical property, a relationship between the geometric dimension of capacitive structure and the measured electrical property established. In this manner, at least one semiconductor fabrication process used to fabricate the capacitive structure may be evaluated based upon the relationship.

In one embodiment, evaluation structure 200 includes at least one electrode operably-coupled to at least one semiconductor device 201. The electrode, configurable as a counter-electrode, may be patterned onto semiconductor device 201. During evaluation, an SPM technique utilizing a conductive SPM probe can be used to make an electrical connection between the electrode and the SPM probe. In this manner, the SPM probe can measure for example, a leakage property associated with an inner layer dielectric of semiconductor device 201. Therefore, the present invention advantageously provides an evaluation structure 200 for evaluating semiconductor processes, semiconductor devices, and associated microelectronic devices.

Figure 3:
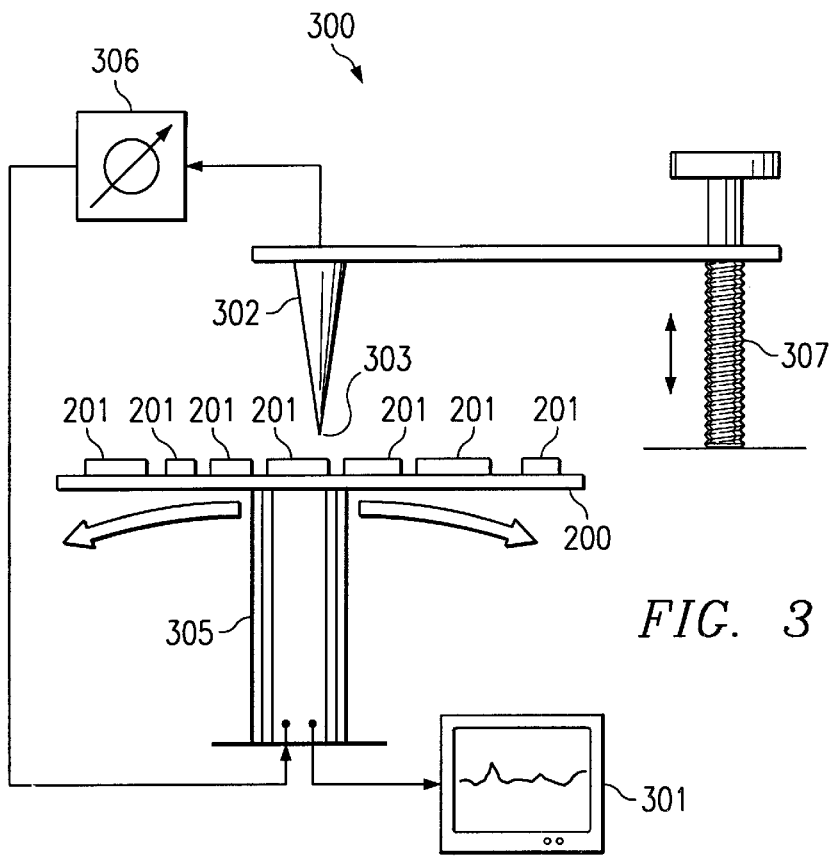
FIG. 3 illustrates a characterization system according to one embodiment of the present invention.

Referring now to FIG. 3 an illustration of a characterization system according to one embodiment of the present invention is shown. The characterization system shown generally at 300, may be used to characterize evaluation structure 200 of FIG. 2. System 300 provides a scanning probe microscope (SPM) for evaluating semiconductor devices and includes a precision measurement standard 301 coupled to a probe 302 for interfacing semiconductor devices 201. The tip of probe 302 includes a sensor 303 coupled to standard 301 for measuring electrical properties such as capacitance, admittance, etc. or other electrical properties used to evaluate and characterize semiconductor devices.

In one embodiment, the tip 303 of probe 302 is preferably configured to be conductive allowing system 300 to measure electrical properties of semiconductor devices by interfacing a submicron test pad. For example, a submicron metal gate on a capacitor structure may be probed by probe 302 providing an advantageous evaluation of an electrical property of the capacitor structure in addition to a topographical measurement of the structure. In one embodiment tip 303 of probe 302 may be configured to be a conductive nanoscopic probe.

In one embodiment of the invention, probe 302 having sensor 303 may be configured to measure multiple characteristics of a semiconductor device. For example, probe 302 may be configured to simultaneously measure a capacitive value and a topographical characteristic of a semiconductor device within the same or proximal region of a semiconductor device. Thus, a region of a semiconductor device may be evaluated such that a relationship between the measured electrical property and another characteristic, such as a topography, may be made thereby affording characterization of semiconductor processes used to create the semiconductor device.

System 300 preferably includes a scanner for moving evaluation structure 202 in a raster pattern thereby allowing probe 302 to make measurements. In one embodiment, the vertical position of probe 302 is sensed relative to the surface of semiconductor device 201 and a feedback control system 306 provides an input to a piezoelectric scanner 305 that moves evaluation structure 202 in a raster pattern. System 300 also provides a computer system 301 that controls which measurements are being made at specified points. The computer system may be configured to drive the scanner 305 to selective positions and evaluate characteristics of semiconductor device 201 on a point-by-point basis. Additionally, system 300 receives the measured information from probe 302 and stores the information in a storage medium in the computer system 301 coupled to system 300.

In one embodiment, more than one characteristic of a semiconductor device may be evaluated by system 300 allowing system 300 to gather several types of information on a point-by-point basis. System 300 also includes a program of instructions deploying a method similar to the methods shown in FIG. 1 or FIG. 4 for measuring an electrical property of the semiconductor device and a selected geometric dimension, or other physical characteristic of the semiconductor device. The program of instructions may be used to determine a relationship between the measured electrical property and another characteristic such as a geometric dimension of the device, thereby allowing system 300 to evaluate at least one semiconductor process based upon the determined relationship.

System 300 may also include a graphical user interface, included in the computer system 301, allowing a user to view the measured information. In one embodiment, the graphical user interface may display any combination of the semiconductor device's topography, measured electrical properties, relationships between measured characteristics, or process variations determined by a relationship between the measured electrical property and a characteristic of the semiconductor device.

Figure 4:
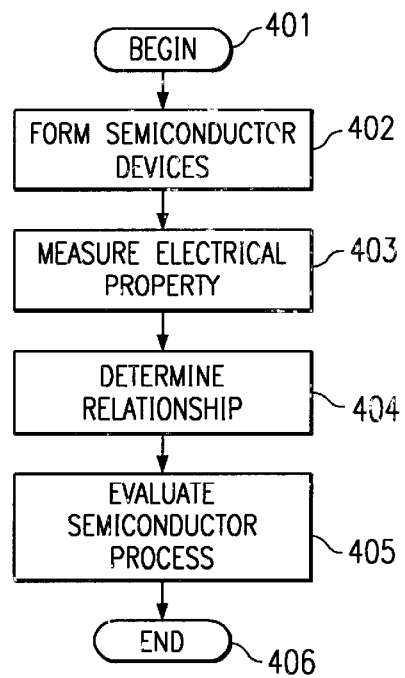
FIG. 4 illustrates a flow diagram of one embodiment of a method for characterizing semiconductor devices and processes according to the present invention.

Referring now to FIG. 4, an illustration of a flow diagram of a method for evaluating semiconductor devices and processes according to one embodiment of the present invention is shown. The method provides an evaluation of at least one selected electrical property of a semiconductor device in relation to a selected geometric dimension of the semiconductor device. The method begins at step 401. At step 402 a plurality of semiconductor devices having at least one geometric dimension are formed using semiconductor processes. One such process is generally described below.

Upon forming the semiconductor devices, the method proceeds to step 402 where at least one electrical property of the semiconductor device is measured using an SPM technique. For example, the selected electrical property may be the capacitance of the semiconductor device and the selected geometric dimension may be a contact area for a capacitor located within the semiconductor device. Therefore, the selected geometric dimension is not limited to a single geometric dimension but may be one of a plurality of different geometric dimensions or sizes provided by the semiconductor device as determined in association with the design of the semiconductor device.

Upon measuring the electrical property, the method then proceeds to step 403 where the method determines a relationship between the measured electrical property and the selected geometric dimension of the semiconductor device. For example, if the selected geometric dimension of the semiconductor device is approximately fifteen nanometers, the method would determine the relationship of the fifteen nanometers device and the measured electrical property.

The method then proceeds to step 404 where the process evaluates at least one semiconductor fabrication process based upon the determined relationship. For example, a thin gate oxide deposition semiconductor process may be evaluated by measuring the capacitance of the semiconductor device in relation to the geometric dimension or size of the semiconductor device. The method then proceeds to step 406 where the method ends.

Therefore, the present invention advantageously allows a semiconductor process to be evaluated by measuring an electrical property of the semiconductor device using an SPM technique and determining a relationship between the selected geometric dimension and the measured electrical property.

A general description of a semiconductor process for developing a semiconductor device is provided. There are several different processes associated with creating semiconductor devices. Four basic processes, layering, patterning, doping, and annealing are generally described for fabricating semiconductor devices.

Layering is a process used to add thin layers of materials to the surface of a wafer. The layers may be insulators, semiconductors, or conductors made from various materials having different thickness and added to the wafer using a variety of techniques. In general, layers are added to wafers by growing the layer or by depositing the layer. Two techniques for growing layers include oxidation and nitridation. An oxide layer may serve a variety of purposes such as electrical isolation between devices, inner layer isolation between conductive layers, and as a dielectric for the gate of a transistor. Oxide layers are generally grown on wafers within a chamber by introducing dry oxygen or a water vapor into the chamber containing the exposed wafers. The thickness of the oxide layer depends on how long the wafer is exposed to the controlled environment. A nitride layer is another commonly grown layer that may serve as a substitute for oxide layers or added in addition to an oxide layer to form a more substantial passivation layer. Nitride layers are grown in a similar manner to oxide layers being exposed to a nitride rich environment within a chamber for a period of time to produce a nitride layer having a desirable thickness.

A layer may also be deposited onto a silicon wafer and is generally accomplished through either chemical or physical vapor deposition. In a chemical deposition, a chemical containing atoms of the material to be deposited reacts with another reactant chemical leaving the product of the chemical reaction to be deposited on the wafer while unwanted by-products are removed in subsequent steps. Chemical vapor deposition is conducted in a controlled environment such as a reaction chamber. Physical vapor deposition involves a source material being heated from a solid to a gaseous state resulting in the source material being deposited onto the surface of the wafer. For example, a sputtering deposition process may deposit a thin film of material on an exposed surface of the wafer with radio-frequency excited ions bombarding a target material and the dislodged atoms adhering to the surface of the wafer.

The second basic process patterning, involves providing patterns that define regions of the semiconductor device. Creating patterns on a wafer surface is accomplished using a multiple step process known as photolithography. During photolithography, a layer of film or photoresist is deposited on the outer surface of the wafer to be patterned. The desired pattern is formed in a photo mask that contains the patterns to be formed on the surface of the wafer. The wafer and the photomask are accurately aligned and exposed to a light source that alters the chemical composition of the photoresist. The wafer is then developed using a solvent that removes the undesirable photoresist resulting in the desired pattern. Upon developing the wafers, an etch process etches away the wafers exposed regions. There are two basic types of etch processes, wet etch and dry etch. A wet etch process involves immersing the wafer in a tank of a chemical enchant for a specified time resulting in the dissolution of the desired material to be etched. A dry etch or plasma etch uses gases and plasma energy rather than acidic reaction to etch the wafer. The plasma etch process occurs in a plasma chamber at a specified temperature and pressure with a specific solution of gas. The gas is excited to a plasma state containing energized ions that etch the surface of the wafer in one direction. Plasma etching is used to create vertical etch profiles.

The third basic process used to fabricate semiconductor devices is doping. Doping generally refers to the introduction of impurities into a semiconductor material causing the semiconductor material have excessive holes or electrons. Diffusion and ion implantation are the two common types of doping processes. In diffusion, dopant atom carriers contained in a highly concentrated form are introduced to the surface of the wafer. Once introduced, dopant atom carriers react with a reactant gas such as oxygen creating highly mobile ions of the desired dopant. Ion implantation is accomplished by bombarding the surface of the wafer with ionized dopant atoms. The atoms penetrate the surface of the wafer and come to rest below the surface. Ion implantation is typically followed by a diffusion process to obtain the desired geometry of the doped region.

The fourth basic process used to fabricate semiconductor devices is annealing. Typically, annealing is the last step in the process and includes high temperature exposure in order to minimize stress on the crystal structure of the wafer. Annealing is also done at intermediate steps in the process to help planarize the surface of the wafer. Additionally, annealing is used to ensure good electrical conduction between a metal layer and an underlying silicon surface by alloying the metal to the underlying surface.

While the disclosed embodiments have been described in detail, it should be understood that various changes, substitutions and alternations can be made to the embodiments without departing from their spirit and scope.

What is claimed is:

1. A method for evaluating properties of a semiconductor device comprising:

a. forming a plurality of semiconductor devices on a semiconductor substrate, the devices having geometric dimensions, the geometric dimensions being formed according to design rules including a minimum design rule, at least one of the devices having at least one geometric dimension approximately equaling the minimum design rule;

b. measuring an electrical property of the plurality of devices related to a selected geometric dimension using a scanning probe microscopy based technique, the measurement being associated with the selected geometric dimension, including the dimension approximately equaling the minimum design rule;

c. determining a relationship between the measured electrical property and the selected geometric dimension of the plurality of semiconductor devices;

d. determining a relationship between the measured electrical property and at least one semiconductor fabrication process; and e. evaluating the semiconductor fabrication process based on the relationship between the measured electrical property and the geometric dimension of the semiconductor devices.

2. The method in claim 1 in which the semiconductor devices are integrated capacitors.

3. The method in claim 1 in which the measured electrical properties include capacitance, leakage, conductivity, resistivity, and voltage.

* * * * *

UNITED STATES PATENT AND TRADEMARK OFFICE
CERTIFICATE OF CORRECTION

PATENT NO.    : 6,498,502 B2
DATED         : December 24, 2002
INVENTOR(S)   : Edwards et al.

It is certified that error appears in the above-identified patent and that said Letters Patent is hereby corrected as shown below:

<u>Title page,</u>
Item [73], Assignee, please change it to read:
-- Texas Instruments Incorporated --

Signed and Sealed this

Third Day of June, 2003

JAMES E. ROGAN
*Director of the United States Patent and Trademark Office*